(12) United States Patent
Ito et al.

(10) Patent No.: US 6,677,557 B2
(45) Date of Patent: Jan. 13, 2004

(54) CERAMIC HEATER

(75) Inventors: Yasutaka Ito, Gifu (JP); Yasuji Hiramatsu, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/019,280

(22) PCT Filed: May 1, 2001

(86) PCT No.: PCT/JP01/03763

§ 371 (c)(1),
(2), (4) Date: Apr. 22, 2002

(87) PCT Pub. No.: WO01/84886

PCT Pub. Date: Nov. 8, 2001

(65) Prior Publication Data

US 2003/0042247 A1 Mar. 6, 2003

(30) Foreign Application Priority Data

May 2, 2000 (JP) .......................................... 2000-134001

(51) Int. Cl.[7] .................................................. H05B 3/68
(52) U.S. Cl. .................................. 219/465.1; 219/444.1
(58) Field of Search ........................... 219/443.1, 444.1, 219/465.1, 466.1, 467.1; 118/724, 725, 728

(56) References Cited

U.S. PATENT DOCUMENTS

| | | | | |
|---|---|---|---|---|
| 5,800,618 A | * | 9/1998 | Niori et al. | 118/723 E |
| 6,084,215 A | * | 7/2000 | Furuya et al. | 219/444.1 |
| 6,465,763 B1 | * | 10/2002 | Ito et al. | 219/444.1 |
| 6,475,606 B2 | | 11/2002 | Niwa | |
| 6,507,006 B1 | * | 1/2003 | Hiramatsu et al. | 219/444.1 |
| 6,534,751 B2 | * | 3/2003 | Uchiyama et al. | 219/444.1 |

FOREIGN PATENT DOCUMENTS

| | | |
|---|---|---|
| JP | 11-40330 | 2/1999 |
| JP | 11-281307 | 10/1999 |

* cited by examiner

*Primary Examiner*—Sang Paik
(74) *Attorney, Agent, or Firm*—Oblon, Spivak, McClelland, Maier & Neustadt, P.C.

(57) ABSTRACT

An object of the present invention is to provide a heater wherein even if a through hole into which lifter pins and the like for supporting a semiconductor wafer will be inserted is made, the temperature in the vicinity of the through hole is not lowered so that the temperature in its heating face is even. The present invention is a ceramic heater comprising a ceramic substrate; and a resistance heating element formed on the surface of the ceramic substrate or inside above-mentioned ceramic substrate, above-mentioned ceramic substrate being equipped with a through hole, wherein the wall face of above-mentioned through hole has a surface roughness of Rmax=0.05 to 200 $\mu$m based on JIS B 0601.

21 Claims, 4 Drawing Sheets

Rmax=5 μm

Rmax=210 μm

Rmax=0.03 μm

CERAMIC HEATER

TECHNICAL FIELD

The present invention relates to a ceramic heater used mainly in the semiconductor industry.

BACKGROUND ART

Semiconductors are very important goods necessary in various industries. A semiconductor chip is produced, for example, by slicing a silicon monocrystal into a given thickness to produce a silicon wafer, and then forming plural integrated circuits and the like on this silicon wafer.

In the manufacturing process of this semiconductor chip, the silicon wafer put on an electrostatic chuck is subjected to various treatments such as etching and CVD, so as to form conductor circuits, elements and so on. Also, a resin for a resist is applied thereto and then the resin is heated and dried.

For such heating, a ceramic heater is used. Heaters using a carbide or a nitride are disclosed in JP Kokai Hei 11-74064, JP Kokai Hei 11-40330 and so on.

SUMMARY OF THE INVENTION

However, through holes, into which pins or lifter pins for supporting a semiconductor wafer will be inserted, are usually formed in such a heater, and thus a problem that the temperature in the vicinity of the through holes drops is caused.

An object of the present invention is to provide a heater wherein its heating face has even temperature even if a through hole is made.

The present invention is a ceramic heater comprising: a ceramic substrate mainly in disc form; and a resistance heating element formed on the surface of the ceramic substrate or inside the ceramic substrate, the ceramic substrate being equipped with a through hole, wherein the wall face of the above-mentioned through hole has a surface roughness of Rmax=0.05 to 200 $\mu$m based on JIS B 0601.

The inventors conducted eager researches. As a result, it has been found out that the reason why the temperature in the vicinity of a through hole in the prior art drops is that ambient gas rises through the through hole by being heated so that the temperature in the vicinity of the through hole drops. Thus, the inventors have come up with the idea that by making the inner wall of the through hole rough and generating turbulent flow in the ambient gas to cause the gas to remain and accumulate heat, a drop in the temperature in the vicinity of the through hole can be prevented.

The present invention is characterized in that the surface roughness of the wall face of a through hole is as follows: Rmax=0.05 to 200 $\mu$m based on JIS B 0601.

Since the surface roughness of the wall face of the through hole is: Rmax=0.05 to 200 $\mu$m, ambient gas tends to remain in the through hole so that heat is easily accumulated. Moreover, the temperature in the vicinity of the through hole does not drop since the contact area between the wall face and the ambient gas is small.

As this ambient gas, air, reactant gas (such as $CF_4$), inert gas (such as nitrogen or argon and the like) and the like are desired.

Rmax is defined as follows according to JIS B 0601: when a portion of a sectional curve is extracted at a standard length and the extracted portion is sandwiched between 2 straight lines which are parallel to the average line of the extracted portion, an interval between the 2 straight lines is measured in the direction of longitudinal magnification of the sectional curve, and then the measured value is represented in micrometers. In other words, Rmax represents a difference in level between the highest mountain and the deepest valley in relation to the average line of the sectional curve.

Ra is obtained by integrating the absolute value of a curve of roughness by the measured length, dividing this by the measured length, and then representing the resultant value in micrometers. By integrating the absolute value of the curve of roughness by the measured length, the area of the portion surrounded by the average line and the roughness curve is calculated. Dividing this by the measured length means to obtain an average height when the mountains and the valleys of the roughness curve are made even.

In the present invention, Rmax is important. This is because the manner that air flows depends on a difference in level between the highest mountain and the deepest valley in relation to the average line of the sectional curve.

The surface roughness JIS B 0601 is more desired to be Ra=0.005 to 20 $\mu$m. This is because, in the case in which unevenness is averagely made in the face of the through hole, turbulent flow tends to be caused in the ambient gas.

The ceramic substrate is desirably a carbide ceramic or a nitride ceramic. This is because these ceramics are superior in thermal conductivity.

The thickness of the ceramic substrate is desirably 50 mm or less. If the thickness is over 50 mm, the ambient gas can be caused to remain in spite of the surface roughness. In the present invention, the advantageous effect thereof is produced particularly in the ceramic substrate whose thickness is relatively thin, that is, 50 mm or less. The thickness is optimally 25 mm or less. This is because temperature controllability is superior since the heat capacity thereof is small.

Figure 1:
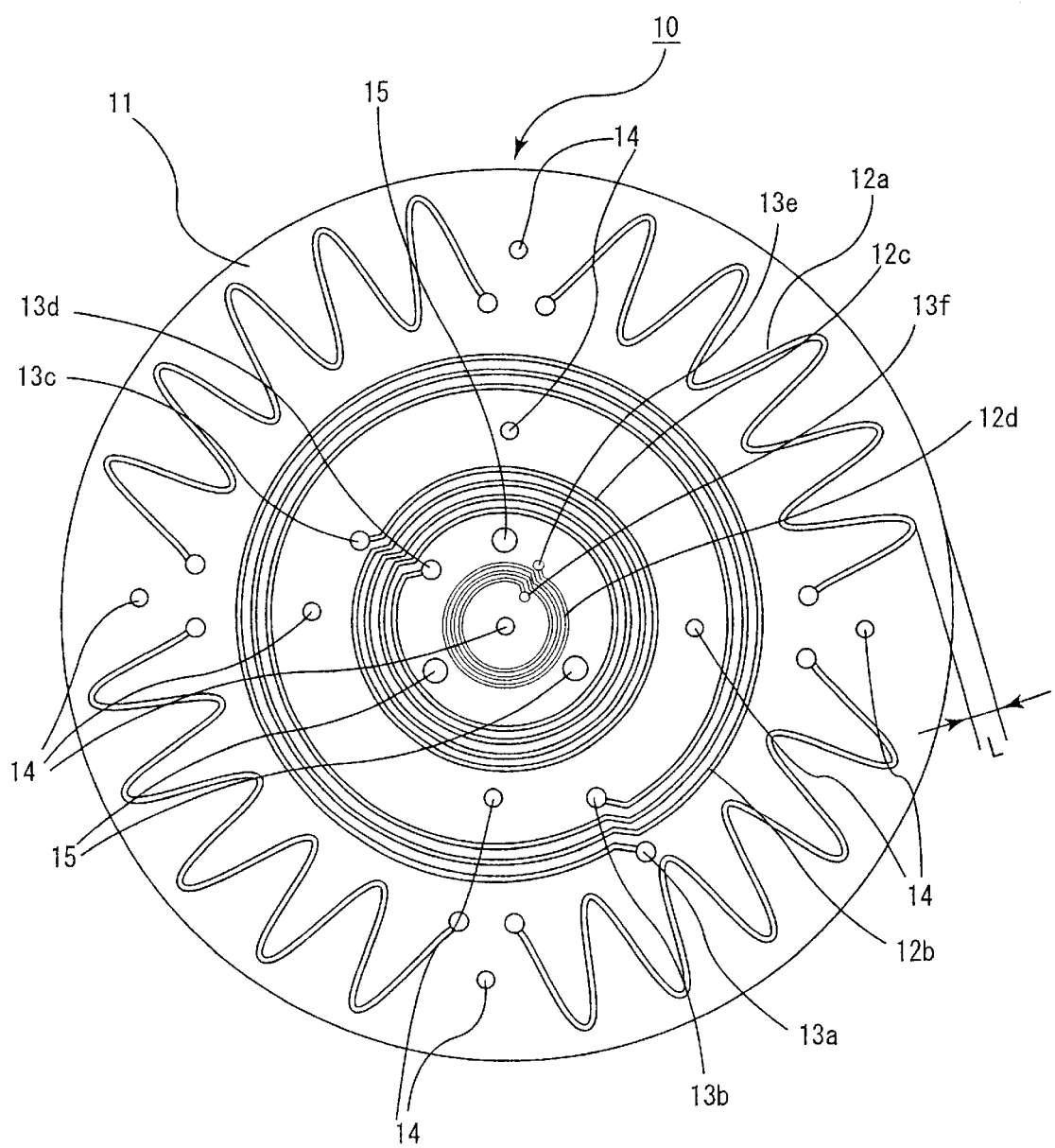
FIG. 1 is a pattern of resistance heating elements of a ceramic heater of the present invention.

| Explanation of symbols | |
|---|---|
| 10 | ceramic heater |
| 11 | ceramic substrate |
| 12 | resistance heating element |
| 13 | terminal pin |
| 14 | bottomed hole |
| 15 | through hole |

DETAILED DISCLOSURE OF THE INVENTION

The present invention will be described according to embodiments hereinafter.

In a ceramic heater according to the present embodiment, it is optimal that a nitride ceramic or a carbide ceramic is used for a ceramic substrate and an oxide ceramic is used for an insulating layer on the surface of the ceramic substrate. The volume resistance value of the nitride ceramic drops easily at high temperature by the formation of solid solution by oxygen, and so on; and the carbide ceramic has electric conductivity so far as the carbide ceramic is not purified to a particularly high degree. Thus, by forming the oxide ceramic as the insulating layer, a short circuit between circuits can be prevented even at high temperature or even if the oxide ceramic contains impurities. Thus, temperature controllability can be ensured.

About the surface of the ceramic substrate, the surface roughness thereof is preferably: Ra=0.05 to 20 μm, and Rmax =0.5 to 200 μm.

Examples of the nitride ceramic constituting the ceramic substrate include metal nitride ceramics such as aluminum nitride, silicon nitride, boron nitride, titanium nitride and the like.

Examples of the above-mentioned carbide ceramic include metal carbide ceramics such as silicon carbide, zirconium carbide, titanium carbide, tantalum carbide, tungsten carbide and the like.

An oxide ceramic may be used as the ceramic substrate, and alumina, silica, cordierite, mullite, zirconia, beryllia and the like may be used.

In the present invention, the ceramic substrate desirably contains a sintering aid. Examples of the sintering aid for aluminum nitride include alkali metal oxides, alkali earth metal oxides and rare element oxides. CaO, $Y_2O_3$, $Na_2O$, $Li_2O$ and $Rb_2O_3$ are particularly preferred among these sintering aids.

Alumina may be used. The content of these sintering aids is desirably from 0.1 to 20% by weight.

In the case of silicon carbide, the sintering aid is $B_4C$, C or AlN.

In the present invention, the ceramic substrate desirably contains from 5 to 5000 ppm of carbon.

The ceramic substrate can be blackened by incorporating carbon. Thus, when the substrate is used as a heater, radiation heat can be sufficiently used.

Carbon may be amorphous or crystalline. When amorphous carbon is used, a drop in the volume resistivity at high temperature can be prevented. When crystalline carbon is used, a drop in the thermal conductivity at high temperature can be prevented. Therefore, both of crystalline carbon and amorphous carbon may be used dependently on use. The carbon content is more preferably from 50 to 2000 ppm.

In the ceramic substrate of the present invention, the thickness thereof is desirably 50 mm or less, particularly desirably 25 mm or less.

Particularly if the thickness of the ceramic substrate is over 25 mm, the heat capacity of the ceramic substrate becomes large. Particularly if a temperature-controlling means is set up to heat or cool it, the temperature following character thereof deteriorates attributed to the large value of the heat capacity.

Particularly, 5 mm or more is optimal. It is desired that the thickness is over 1.5 mm. A dispersion of the thickness of the ceramic substrate is preferably±3%. A dispersion of the thermal conductivity is preferably±10%.

The insulating layer 18 used in the present invention is desirably an oxide ceramic. Specifically, silica, alumina, mullite, cordierite, beryllia, and the like can be used.

Such an insulating layer 18 maybe formed: by spin-coating the ceramic substrate with a sol solution wherein an alkoxide is hydrolyzed and polymerized, and then drying and firing the solution; or by sputtering, CVD and the like. The surface of the ceramic substrate may be subjected to oxidization-treatment to deposit an oxide layer.

In the ceramic heater of the present invention, a semiconductor wafer 19 is put on the wafer-putting face of the ceramic substrate in the state that the wafer 19 contacts the wafer-putting face, and also the semiconductor wafer may be supported by supporting pins, supporting spheres and the like, and held to keep a given interval apart form the ceramic substrate.

The separating distance is desirably from 5 to 5000 μm.

By moving the lifter pins upward or downward, the semiconductor wafer can be: received from a carrier machine; put on the ceramic substrate; or heated with the wafer being supported.

The diameter of the ceramic substrate of the present invention is desirably 200 mm or more, particularly desirably 12 inches (300 mm) or more. This is because wafers having such a diameter become the main stream of semiconductor wafers in the next generation.

The external form of the ceramic substrate is desirably equal to or larger than that of the wafer. Heating may be performed in the state that the ceramic substrate does not contact the wafer.

The ceramic substrate desirably has closed pores. The leakage amount of helium is desirably $10^{-7}$ Pa·m$^3$/sec or less. This is for preventing a leakage of a coolant gas for forcible cooling.

Furthermore, the volume resistance of the ceramic substrate, or the volume resistivity of the insulating layer is desirably $10^5$ Ω·cm or more at 100° C. or higher. This is to ensure insulation between the resistance heating elements.

The flatness of the ceramic substrate is advantageous if it is 50 μm or less.

The Young's modulus thereof is preferably from 80 to 450 GPa.

The average particle diameter of particles constituting the ceramic is preferably 10 μm or less.

The ceramic heater of the present invention is used as a device for: producing a semiconductor; or examining a semiconductor. Specific examples of the device include an electrostatic chuck, a wafer prober, a susceptor and the like.

In case that the ceramic heater is used as an electrostatic chuck, an electrostatic electrode and an RF electrode are formed besides the resistance heating element. In case that the ceramic heater is used as a wafer prober, a chuck top conductor layer is formed as a conductor on the surface, and further a guard electrode and a ground electrode are formed, as conductors, inside.

It is optimal that the ceramic substrate for a device for producing/examining a semiconductor of the present invention is used at 100° C. or higher, and desirably 200° C. or higher.

In the present invention, thermocouples may be embedded in bottomed holes in the ceramic substrate if necessary. With the thermocouples, the temperature of the resistance heating elements is measured, and on the basis of the data, voltage or electric current amount is changed to control the temperature thereof.

The size of the connecting portions of metal wires of the thermocouples is the same as the strand diameter of the respective metal wires or more, and the size is preferably 0.5 mm or less. Such a structure makes the heat capacity of the connecting portion small, and causes temperature to be correctly and speedy converted to an electric current value. For this reason, temperature controllability is improved so that temperature distribution on the heating face of the wafer becomes small.

Examples of the above-mentioned thermocouple include K, R, B, S, E, J and T type thermocouples, as described in JIS-C-1602 (1980).

Brazing gold or brazing silver may be used to adhere the above-mentioned temperature-measuring elements to the bottoms of bottomed holes 14. After the temperature-measuring elements are inserted into the bottomed holes 14, the holes 14 may be sealed with a heat-resistant resin. The two manners may be used together.

Examples of the above-mentioned heat-resistant resin include thermosetting resins, particularly epoxy resin, polyimide resin, bismaleimide-triazine resin and the like. These resins may be used alone or in combination of two or more.

As the above-mentioned brazing gold, desired is at least one selected from an alloy of 37 to 80.5% by weight of Au and 63 to 19.5% by weight of Cu, and an alloy of 81.5 to 82.5% by weight of Au and 18.5 to 17.5% by weight of Ni. These have a melting temperature of 900° C. or more, and are not easily melted in high temperature regions.

As the brazing silver, for example, a Ag—Cu type can be used.

As illustrated in FIG. 1, the heating element 12 is desirably divided into at least two circuits, and is more desirably divided into 2 to 10 circuits. This is because by dividing into plural circuits, electric powers applied to the respective circuits are controlled so that the amount of generated heat can be changed. Thus, the temperature on the wafer-heating face 11a can be adjusted.

Examples of the pattern of the heating elements 12 include a combination of concentric circles with bending lines as shown in FIG. 1, a spiral, eccentric circles and the like.

In the present invention, the insulating layer is deposited on the surface of the ceramic substrate before the heating elements are formed. The insulating layer may be formed: by spin-coating the ceramic substrate with a sol solution wherein an alkoxide is hydrolyzed and polymerized and then drying and firing the sol solution; or by spattering or CVD. An oxide layer may be formed by firing the surface of the ceramic substrate in oxidizing atmosphere.

In case that the heating elements are formed on the surface of the ceramic substrate 11, the following method is preferred: a method of applying a conductor containing paste containing metal particles to the surface of the ceramic substrate 11 to form a conductor containing paste layer having a given pattern, and firing this to sinter the metal particles on the surface of the ceramic substrate 11. If the metal particles are melted and adhered to each other and the metal particles and the ceramic are melted and adhered to each other in the sintering of the metal, the sintering is sufficient.

In the present embodiment, a pattern as illustrated in FIG. 1 is adopted. In the ceramic substrate: 12d exists as a resistance heating element-formed area 1; 12c exists as a resistance heating element-formed area 2; 12b exists as a resistance heating element-formed area 3; and 12a exists as a resistance heating element-formed area 4.

Buffering areas are disposed between the resistance heating element-formed area 1 and the resistance heating element-formed area 2, between the resistance heating element-formed area 2 and the resistance heating element-formed area 3, and between the resistance heating element-formed area 3 and the resistance heating element-formed area 4. By the presence of the buffering areas, no influence is generated on the resistance heating element-formed area 1 or the resistance heating element-formed area 3 even if a large electric power is applied to the resistance heating element-formed area 2 and the temperature thereof rises. Therefore, temperature control, such as lowering of the temperatures of the resistance heating element-formed area 1 and the resistance heating element-formed area 3, is unnecessary. By simple control, a temperature difference in the heating face can be reduced.

It is necessary that the distance L: from the outermost circumference of the resistance heating element-formed area to the side face of the above-mentioned ceramic substrate, is 35 mm or less. It is optimal that the distance L is 25 mm or less. If the distance L is 25 mm or less, the warp amount thereof can be made very small.

Furthermore, it is desired that the distance L from the outermost circumference of the resistance heating element-formed area to the side face of the above-mentioned ceramic substrate is 0.5 mm or more. If the distance L is less than 0.5 mm, in case that the supporting case is made of a metal, an electric short circuit is caused or the handling property thereof deteriorates.

In this embodiment, the width of the resistance heating element-formed areas is adjusted to 5 to 30% of the diameter.

Through holes 15 are formed in the ceramic substrate 11. Lifter pins for receiving or delivering a semiconductor wafer 19 or a liquid crystal substrate are inserted thereinto.

The diameter of the through holes is preferably from 0.05 to 20 mm. If the diameter is too small, the lifter pins becomes narrow so that an object to be heated such as a semiconductor wafer and the like, cannot be held. If the diameter is too large, an area which cannot be heated is generated in the object to be heated.

The resistance heating elements are desirably formed within the range of 20 mm or less from the inner wall of the through holes. At the range of more than 20 mm from the inner wall of the through holes, only adjusting the surface roughness is not enough to prevent the generation of a temperature-falling area in the vicinity of the through holes.

About the surface roughness of the through holes, Rmax is desirably from 0.05 to 200 $\mu$m, and Ra is desirably from 0.005 to 20 $\mu$m. If the surface roughness Rmax is less than 0.05 $\mu$m, the heated air becomes laminar flow so that the air blows through the heating face. The air does not remain so that heat cannot be accumulated. On the other hand, if the Rmax is over 200 $\mu$m, the faces themselves of the through holes become like a heat-radiating fin. Thus, heat is radiated so that the temperature in the vicinity of the through holes drops. Also, if the set temperature of the heater is low, conversely, the air does not move at all so that heat is excessively accumulated. Thus, the temperature in the vicinity of the through holes may rise.

In any case, the Rmax is optimally from 0.05 to 200 $\mu$m in order to make the temperature in the vicinity of the through holes equal to the temperature on the heating face.

The surface roughness Ra of the through holes is more desirably from 0.005 to 20 $\mu$m. This is because by making irregularities averagely on the wall face of the through holes, the flow of air is easily made into turbulent flow. Thus, the wall face has heat-accumulating effect or temperature keeping effect.

The surface roughness can be adjusted by using rodlike diamond grindstone or subjecting the inner wall to blast treatment.

Temperature-measuring elements are formed in the bottomed holes 14. At the resistance heating elements 12, terminal portions 13a to 13e are formed.

As the resistance heating element-formed areas, concentric circles, a spiral or bending lines are formed. Any of the resistance heating element-formed areas is preferably composed of one circuit. This is because the area composed of one circuit is easily controlled.

When the heating elements are formed on the surface of the ceramic substrate 11, the thickness of the heating elements is preferably from 1 to 30 $\mu$m and more preferably from 1 to 10 $\mu$m.

When the heating elements are formed on the surface of the ceramic substrate 11, the width of the heating elements is preferably from 0.1 to 20 mm and more preferably from 0.1 to 5 mm.

The resistance value of the heating elements can be changed dependently on their width or thickness. However, the above-mentioned ranges are most practical. The resistance value becomes larger as the heating elements become thinner and narrower.

By setting the position where the heating elements are formed in this way, heat generated from the heating elements diffuses in the whole of the ceramic substrate while the heat is conducted. Thus, temperature distribution in the face for heating an object to be heated (a silicon wafer) is made even so that temperatures of respective parts of the object to be heated are made even.

The heating elements may have a rectangular section or an elliptical section. They desirably have a flat section. From the flat section, heat is more easily radiated toward the wafer-heating face. Thus, a temperature distribution in the wafer-heating face is not easily generated.

The aspect ratio (the width of the heating element/the thickness of the heating element) of the section is desirably from 10 to 5000.

Adjustment thereof into this range makes it possible to increase the resistance value of the heating elements and keep the evenness of the temperature in the wafer-heating face.

In condition that the thickness of the heating elements is made constant, the amount of heat conduction toward the wafer-heating face of the ceramic substrate 11 becomes small if the aspect ratio is smaller than the above-mentioned range. Thus, a thermal distribution similar to the pattern of the heating elements is generated in the wafer-heating face. On the other hand, if the aspect ratio is too large, the temperature of the portions just above the middle lines of the heating elements becomes high so that a thermal distribution similar to the pattern of the heating elements is generated in the wafer-heating face. Accordingly, if temperature distribution is considered, the aspect ratio of the section is preferably from 10 to 5000.

When the heating elements are formed on the surface of the ceramic substrate 11, the aspect ratio is desirably from 10 to 200. When the heating elements are formed inside the ceramic substrate 11, the aspect ratio is desirably from 200 to 5000.

The aspect ratio becomes larger in case that the heating elements are formed inside the ceramic substrate 11. This is based on the following reason. If the heating elements are formed inside, the distance between the wafer-heating face and the heating elements becomes short so that temperature evenness in the surface deteriorates. It is therefore necessary to make the heating elements themselves flat.

The conductor containing paste is not particularly limited, and is preferably a paste containing not only metal particles or a conductive ceramic for keeping electrical conductivity but also a resin, a solvent, a thickener and so on.

The above-mentioned metal particles are preferably made of, for example, a noble metal (gold, silver, platinum or palladium), lead, tungsten, molybdenum, nickel and the like. These may be used alone or in combination of two or more. These metals are not relatively easily oxidized, and have a resistance value sufficient for generating heat.

Examples of the above-mentioned conductive ceramic include carbides of tungsten and molybdenum. These may be used alone or in combination of two or more.

The particle diameter of these metal particles or the conductive ceramic particles is preferably from 0.1 to 100 $\mu$m. If the particle diameter is too fine, that is, less than 0.1 $\mu$m, they are easily oxidized. On the other hand, if the particle diameter is over 100 $\mu$m, they are not easily sintered so that the resistance value becomes large.

The shape of the above-mentioned metal particles may be spherical or scaly. When these metal particles are used, they may be a mixture of the spherical particles and the scaly particles.

In case that the above-mentioned metal particles are made of scaly particles or a mixture of spherical particles and scaly particles, a metal oxide between the metal particles is easily retained and adhesiveness between the heating element 12 and a nitride ceramic and the like becomes certain. Moreover, the resistance value can be made large. Thus, this case is profitable.

Examples of the resin used in the conductor containing paste include epoxy resins, phenol resins and the like. Examples of the solvent are isopropyl alcohol and the like. Examples of the thickener are cellulose and the like.

In the conductor containing paste, a metal oxide is preferably added to the metal particles, and the heating elements are desirably formed to be a sintered body of the metal particles and the metal oxide, as described above. By sintering the metal oxide together with the metal particles in this way, the nitride ceramic or the carbide ceramic, which are the ceramic substrate, can be closely adhered to the metal particles.

The reason why the adhesiveness to the nitride ceramic or the carbide ceramic is improved by mixing the metal oxide is unclear, but would seem to be based on the following. The surface of the metal particles and the surface of the nitride ceramic or the carbide ceramic are slightly oxidized so that an oxidized film is formed thereon. Pieces of these oxidized films are sintered and integrated with each other through the metal oxide so that the metal particles and the nitride ceramic or the carbide ceramic are closely adhered to each other.

A preferred example of the above-mentioned metal oxide is at least one selected from the group consisting of lead oxide, zinc oxide, silica, boron oxide ($B_2O_3$), alumina, yttria, and titania.

These oxides make it possible to improve adhesiveness between the metal particles and the nitride ceramic or the carbide ceramic without increasing the resistance value of the heating elements.

When the total amount of the metal oxides is set to 100 parts by weight, the weight ratio of lead oxide, zinc oxide, silica, boron oxide ($B_2O_3$), alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50. The ratio is preferably adjusted within the scope that the total thereof is not over 100 parts by weight.

By adjusting the amounts of these oxides within these ranges, the adhesiveness to the nitride ceramic can be particularly improved.

The addition amount of the metal oxide to the metal particles is preferably 0.1% by weight or more and less than 10% by weight. The area resistivity when the conductor containing paste having such a structure is used to form the heating elements is preferably from 1 to 45 m$\Omega$/□.

If the area resistivity is over 45 m$\Omega$/□, the amount of generated heat for an applied voltage becomes too small so that, in the ceramic substrate 11 wherein heating elements are set on its surface, their generated heat amount is not easily controlled. If the addition amount of the metal oxide is 10% or more by weight, the area resistivity exceeds 50 m$\Omega$/□ so that the generated heat amount becomes too small. Thus, temperature control becomes difficult so that evenness of temperature distribution deteriorates.

In case that the heating elements are formed on the surface of the ceramic substrate 11, a metal covering layer 120 (reference to FIG. 2) is preferably formed on the surface of the heating element. The metal covering layer prevents a change in the resistance value attributed to oxidization of the inner metal sintered body. The thickness of the formed metal covering layer is preferably from 0.1 to 10 $\mu$m.

The metal used when the metal covering layer is formed is not particularly limited if the metal is a metal which is non-oxidizable. Specific examples thereof include gold, silver, palladium, platinum, nickel and the like. These may be used alone or in combination of two or more. Among these metals, nickel is preferred.

In the heating elements, terminals for connecting to a power source are necessary. The terminals are attached to the heating elements through a solder layer 17. Nickel effectively prevents thermal diffusion of solder. An example of the connecting terminals is terminal pins 13 made of Koval.

In case that the connecting terminals are connected, an alloy such as silver-lead, lead-tin, bismuth-tin and the like is used as the solder. The thickness of the solder layer 17 is preferably from 0.1 to 50 $\mu$m. This range is a range sufficient to ensure the connection based on the solder.

The following will describe the process for manufacturing a ceramic heater of the present invention.

A process for manufacturing a ceramic heater 10 (reference to FIG. 2) wherein heating elements are formed on the bottom face of a ceramic substrate will be described.

(1) Step of Forming the Ceramic Substrate

Powder of the above-mentioned nitride ceramic or carbide ceramic is blended with a sintering aid such as yttria, a binder and so on based on the necessity, to prepare a slurry. Thereafter, this slurry is made into a granular form by spray-drying and the like. The granule is put into a mold and pressed to be formed into a plate form or the like form. Thus, a raw formed body (green) is formed.

Next, portions which will be the through holes 15, into which the supporting pins for supporting a silicon wafer will be inserted, and portions which will be the bottomed holes 14, into which temperature-measuring elements such as thermocouples will be embedded are made in the raw formed body if necessary.

Next, this raw formed body is heated and fired to be sintered. Thus, a plate made of the ceramic is manufactured. Thereafter, the plate is made into a given shape to manufacture the substrate 11. The shape of the raw formed body may be such a shape that the sintered body thereof can be used as it is. By heating and firing the raw formed body under pressure, the ceramic substrate 11 having no pores can be manufactured. It is sufficient that the heating and the firing are performed at sintering temperature or higher. The heating and firing temperatures are from 1000 to 2500° C. for the nitride ceramic or the carbide ceramic.

By grinding the through holes 15 with a rodlike diamond grindstone or subjecting the inner walls thereof to blast treatment, the surface roughness Rmax of the wall faces is set to 0.05 to 200 $\mu$m.

Furthermore, the surface roughness Ra of the wall faces of the through holes 15 is desirably from 0.005 to 20 $\mu$m. The through holes may be formed in the sintered body by drilling and the like.

(2) Step of Printing a Conductor Containing Paste on the Ceramic Substrate

A conductor containing paste is generally a fluid comprising metal particles, a resin and a solvent, and has high viscosity. This conductor containing paste is printed in portions where heating elements are to be disposed by screen printing and the like, to form a conductor containing paste layer. Since it is necessary that the heating elements make the temperature of the whole of the ceramic substrate even, the conductor containing paste is desirably printed into a pattern composed of a combination of concentric circles-like and bending lines, as shown in FIG. 1.

The conductor containing paste layer is desirably formed in such a manner that a section of the heating element 12 subjected to the firing will be rectangular and flat.

(3) Firing of the Conductor Containing Paste

The conductor containing paste layer printed on the bottom face of the substrate is heated and fired to remove the resin and the solvent and further sinter the metal particles. Thus, the metal particles are baked onto the bottom face of the ceramic substrate 11 to form the heating element 12. The heating and firing temperature is preferably from 500 to 1000° C.

If the above-mentioned metal oxide is added to the conductor containing paste, the metal particles, the substrate and the metal oxide are sintered to be integrated with each other. Thus, the adhesiveness between the heating element 12 and the substrate 11 is improved.

(4) Forming a Metal Covering Layer

A metal covering layer is desirably deposited on the surface of the heating element 12. The metal covering layer can be formed by electroplating, electroless plating, sputtering and the like. From the viewpoint of mass-productivity, electroless plating is optimal.

(5) Fitting of Terminals and So on

Terminals (terminal pins 13) for connection to a power source are fitted up to ends of the pattern of the heating element 12 with solder. Thermocouples are fixed into the bottomed holes 14 with brazing silver, brazing gold and the like. The bottomed holes are sealed with a heat resistant resin, such as a polyimide, so as to finish the manufacture of the ceramic heater 10.

In the ceramic heater of the present invention, electrostatic electrodes may be set up to manufacture an electrostatic chuck, or a chuck top conductor layer may be arranged to manufacture a wafer prober.

BEST MODES FOR CARRYING OUT THE INVENTION

EXAMPLE 1

Figure 2:
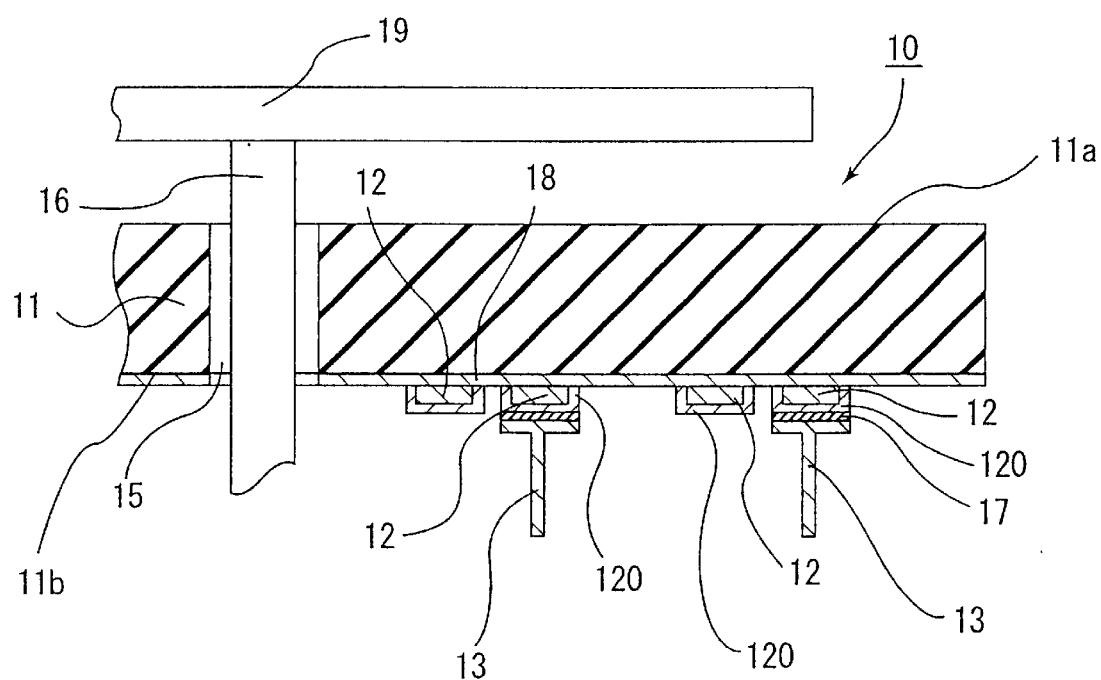
FIG. 2 is a sectional view of a ceramic heater of the present invention.

Manufacture of a Ceramic Heater Made of SiC
(Reference to FIG. 2)

(1) A composition comprising 100 parts by weight of SiC powder (average particle diameter: 0.3 μm), 4 parts by weight of $B_4C$ as a sintering aid, 12 parts by weight of an acrylic binder and an alcohol was subjected to spray-drying to make granular powder.

(2) Next, this granular powder was put into a mold and formed into a flat plate form to obtain a raw formed body (green).

(3) The raw formed body subjected to the working treatment was hot-pressed at 2100° C. and a pressure of 18 MPa to obtain a ceramic substrate made of SiC and having a thickness of 3 mm.

Next, a disk having a diameter of 210 mm was cut out from the surface of this plate formed body and then the surface was grinded into a mirror-plane until the surface would have Ra=0.1 μm. In this way, a ceramic substrate 11 was produced.

The ceramic substrate 11 was spin-coated with a sol solution obtained by hydrolyzing and polymerizing a mixture solution comprising 25 parts by weight of tetraethylsilicate, 37.6 parts by weight of ethanol, and 0.3 part by weight of hydrochloric acid while stirring the mixture solution for 24 hours. Next, the ceramic substrate 11 was dried at 80° C. for 5 hours, and fired at 1000° C. for 1 hour to form a $SiO_2$ film having a thickness of 2 μm on the surface of the ceramic substrate 11 made of SiC.

This sintered body was drilled to make portions which would be through holes 15 (diameter: 5 mm) into which supporting pins or lifter pins for a silicon wafer would be inserted, and portions (diameter: 1.1 mm, depth: 2 mm) which would be bottomed holes 14 into which thermocouples would be embedded. The through holes were ground with a rodlike grindstone (#800) to set the Rmax thereof to 5 μm. The Ra thereof was 0.3 μm.

(4) A conductor containing paste was printed on the ceramic substrate 11 obtained in the above-mentioned (3) by screen printing. The printed pattern was a pattern composed of a combination of concentric circles-like and bending lines as illustrated in FIG. 1.

However, the outermost circumference of the resistance heating element-formed areas was set at 30 mm apart from the side face of the above-mentioned ceramic substrate. The distance between the resistance heating element and the inner wall of the through holes was 1 mm.

The used conductor containing paste was Solvest PS603D made by Tokuriki Kagaku Kenkyu-zyo, which is used to form plated through holes in printed circuit boards.

This conductor containing paste was a silver paste and contained 7.5 parts by weight of metal oxides comprising lead oxide (5% by weight), zinc oxide (55% by weight), silica (10% by weight), boron oxide (25% by weight) and alumina (5% by weight) per 100 parts by weight of silver. The silver particles had an average particle diameter of 4.5 μm, and were scaly.

(5) Next, the ceramic substrate 11 on which the conductor containing paste was printed was heated and fired at 780° C. to sinter silver in the conductor containing paste and bake it onto the substrate 11. Thus, heating elements 12 were formed. The silver heating elements 12 had a thickness of 5 μm, a width of 2.4 mm and an area resistivity of 7.7 mΩ/□.

(6) The substrate 11 formed in the above-mentioned (5) was immersed into an electroless nickel plating bath comprising an aqueous solution containing 80 g/L of nickel sulfate, 24 g/L of sodium hypophosphite, 12 g/L of sodium acetate, 8 g/L of boric acid, and 6 g/L of ammonium chloride, so as to precipitate a metal covering layer (nickel layer) having a thickness of 1 μm on the surface of the silver-lead heating elements 12.

(7) By screen printing, a silver-lead solder paste (made by Tanaka Kikinzoku Kogyo Co.) was printed on portions onto which terminals for attaining connection to a power source would be set up, to form a solder layer.

Next, terminal pins 13 made of Koval were put on the solder layer, heated and reflowed at 420° C. to attach the terminal pins 13 onto the surface of the heating elements 12.

(8) Thermocouples for controlling temperature were fitted into the bottomed holes 14 and then a ceramic adhesive agent (Aron ceramic, made by Toagosei Co., Ltd.) was embedded therein to fix them. In this way, a ceramic heater 10 was obtained.

EXAMPLE 2

The present example complied with Example 1, but the through holes were subjected to sandblast treatment with SiC powder having a particle diameter of 100 μm, to set the surface roughness of the side walls of the through holes: Rmax=120 μm. The Ra thereof was 18 μm.

EXAMPLE 3

The present example complied with Example 1, but the through holes were subjected to sandblast treatment with SiC powder having a particle diameter of 15 μm, to set the surface roughness of the side walls of the through holes: Rmax=20 μm. The Ra thereof was 5 μm.

EXAMPLE 4

The present example complied with Example 1, but the side walls of the through holes were polished with a diamond paste having an average particle diameter of 0.25 μm to set the surface roughness of the side walls of the through holes: Rmax=0.5 μm. The Ra thereof was 0.01 μm.

Comparative Example 1

The present comparative example was performed in the same way as in Example 1, but through holes were made with a drill and no treatment were conducted. The surface roughness of the inner walls of the through holes was set: Rmax=210 μm. The Ra thereof was 25 μm.

Comparative Example 2

The present comparative example was performed in the same way as in Example 1, but the surface roughness Rmax of the side walls of the through holes were set to: Rmax=0.03 μm with a diamond paste having an average particle diameter of 0.05 μm. The Ra thereof was 0.004 μm.

EXAMPLE 5

Manufacture of a Ceramic Heater Made of
Aluminum Nitride (Reference to FIG. 1)

(1) A composition comprising 100 parts by weight of aluminum nitride powder (average particle diameter: 0.6

μm), 4 parts by weight of yttria (average particle diameter: 0.4 μm), 12 parts by weight of an acrylic binder and an alcohol was subjected to spray-drying to make granular powder.

(2) Next, this granular powder was put into a mold and formed into a flat plate form to obtain a raw formed body (green).

(3) The raw formed body subjected to the processing treatment was hot-pressed at 1800° C. and a pressure of 200 kg/cm$^2$ to obtain a ceramic substrate made of aluminum nitride and having a thickness of 3 mm.

Next, a disk having a diameter of 210 mm was cut out from this plate formed body to obtain a ceramic substrate 11. The surface of this substrate was coated with the sol solution used in Example 1, and the substrate was dried and fired to form a SiO$_2$ film having a thickness of 2 μm.

This sintered body was drilled to make: portions which would be through holes 15 (diameter: 10 mm) into which supporting pins or lifter pins for a silicon wafer would be inserted; and portions (diameter: 1.1 mm, depth: 2 mm) which would be bottomed holes 14 into which thermocouples would be embedded. The through holes were ground with a rodlike grindstone to set the Rmax thereof to 5 μm. The Ra thereof was 3.0 μm. It is presumed that the wall faces of the through holes are averagely roughened since particles of aluminum nitride drop out easily.

(4) A conductor containing paste was printed on the substrate 11 obtained in the above-mentioned (3) by screen printing.

The printed pattern was a pattern composed of a combination of concentric circles-like and bending lines-like as illustrated in FIG. 1.

However, the outermost circumference of the resistance heating element-formed areas was set at 30 mm apart from the side face of the above-mentioned ceramic substrate. The distance between the resistance heating element and the inside of the through hole was 1 mm.

The used conductor containing paste was Solvest PS603D made by Tokuriki Kagaku Kenkyu-zyo, which is used to form plated through holes in printed circuit boards.

This conductor containing paste was a silver-lead paste and contained 7.5 parts by weight of metal oxides comprising lead oxide (5% by weight), zinc oxide (55% by weight), silica (10% by weight), boron oxide (25% by weight) and alumina (5% by weight) per 100 parts by weight of silver. The silver particles had an average particle diameter of 4.5 μm, and were scaly.

(5) Next, the substrate 11 on which the conductor containing paste was printed was heated and fired at 780° C. to sinter silver in the conductor containing paste and bake it onto the substrate 11. Thus, heating elements 12 were formed. The heating elements 12 had a thickness of 5 μm, a width of 2.4 mm and an area resistivity of 7.7 mΩ/□.

(6) The substrate 11 formed in the above-mentioned (5) was immersed into an electroless nickel plating bath comprising an aqueous solution containing 80 g/L of nickel sulfate, 24 g/L of sodium hypophosphite, 12 g/L of sodium acetate, 8 g/L of boric acid, and 6 g/L of ammonium chloride, so as to precipitate a metal covering layer (nickel layer) having a thickness of 1 μm on the surface of the silver-lead heating element 12.

(7) By screen printing, a silver-lead solder paste (made by Tanaka Kikinzoku Kogyo Co.) was printed on portions onto which terminals for attaining connection to a power source would be set up, to form a solder layer.

Next, terminal pins 13 made of Koval were put on the solder layer, heated and reflowed at 420° C. to attach the terminal pins 13 onto the surface of the heating elements 12.

(8) Thermocouples for controlling temperature were fitted into the bottomed holes 14 and then a ceramic adhesive agent (Aron ceramic, made by Toagosei Co., Ltd.) was embedded therein to fix them. In this way, a ceramic heater 10 was obtained.

EXAMPLE 6

The present example complied with Example 1, but the side walls of the through holes were polished with a diamond paste having an average particle diameter of 0.1 μm to set the surface roughness of the side walls of the through holes : Rmax=0.06 μm. The Ra thereof was 0.01 μm.

EXAMPLE 7

The present example complied with Example 1, but the thickness of the ceramic substrate was set to 25 mm.

EXAMPLE 8

The present example complied with Example 1, but the thickness of the ceramic substrate was set to 45 mm.

EXAMPLE 9

(1) The paste obtained by mixing: 100 parts by weight of aluminum nitride powder (made by Tokuyama Corp., average particle diameter: 1.1 m); 4 parts by weight of yttria (average particle diameter: 0.4 pm); 11.5 parts by weight of an acrylic binder; 0.5 part by weight of a dispersant; and 53 parts by weight of alcohols comprising 1-butanol and ethanol, was used to conduct formation by a doctor blade method, so as to obtain a green sheet 0.47 mm in thickness.

(2) Next, this green sheet was dried at 80° C. for 5 hours, and subsequently the following portions were made by punching: portions which had a diameter of 5 mm (diameter when it is sintered is: 3.8 mm) and would be through holes into which supporting pins for a semiconductor wafer would be inserted; and portions which would be conductor-filled through holes for connecting external terminals.

(3) The following we remixed to prepare a conductor containing paste A: 100 parts by weight of tungsten carbide particles having an average particle diameter of 1 μm, 3.0 parts by weight of an acrylic binder, 3.5 parts by weight of α-terpineol solvent, and 0.3 part by weight of a dispersant.

The following were mixed to prepare a conductor containing paste B: 100 parts by weight of tungsten particles having an average particle diameter of 3 μm, 1.9 parts by weight of an acrylic binder, 3.7 parts by weight of α-terpineol solvent, and 0.2 part by weight of a dispersant.

This conductor containing paste A was printed on the green sheet by screen printing, so as to form a conductor containing paste layer. The printed pattern was a concentric circular pattern.

Furthermore, the conductor containing paste B was filled into the through holes for the conductor-filled through holes for connecting the external terminals.

Thirty four green sheets on which no tungsten was printed were stacked on the upper side (heating face) of the green sheet subjected to the above-mentioned processing, and the same thirteen green sheets were stacked on the lower side of the green sheet. A green sheet on which a conductor containing paste layer composed of a pattern of electrostatic electrodes was printed was laminated thereon, and further two green sheets on which no tungsten paste was printed were laminated thereon. These were pressed at 130° C. and a pressure of 8 MPa to form a lamination.

(4) Next, the resultant lamination was degreased at 600° C. in the atmosphere of nitrogen gas for 5 hours and hot-pressed at 1890° C. and a pressure of 15 MPa for 3 hours to obtain an aluminum nitride plate having a thickness of 3 mm. This was cut out into a disk having a diameter of 310 mm to prepare a plate made of aluminum nitride and having therein resistance heating elements with a thickness of 6 μm and a width of 10 mm. The distance between the through hole and the resistance heating elements was 18 mm.

(5) Next, the inner walls of the through holes made in the plate obtained in the (4) were ground with a rodlike grindstone (#800) to set the Rmax thereof to 5 μm. The Ra thereof was 0.3 μm.

(6) Furthermore, portions where the conductor-filled through holes were made were hollowed out to make blind holes. Brazing gold comprising Ni—Au was used, heated and reflowed at 700° C. to connect the external terminals made of Koval to the blind holes.

About the connection of the external terminals, a structure wherein a support of tungsten is supported at three points is desirable. This is because the reliability of the connection can be kept.

(7) Next, thermocouples for controlling temperature were buried in the bottomed holes.

Comparative Example 3

The present comparative example complied with Comparative Example 1, but the thickness of the ceramic substrate was set to 53 mm.

Comparative Example 4

The present comparative example was performed in the same way as in Example 9, but the distance between the through hole and the resistance heating element was set to 25 mm.

Furthermore, the temperatures of the heaters of Examples and Comparative Examples were raised to 400° C. A temperature difference between the vicinity of the through holes and the inner portion of the heating face of each of them was measured with a thermo-viewer (made by Japan Datum, IR-16-2012-0012).

A time until the temperature of each of the heaters of Examples and Comparative Examples was raised to 200° C. was measured.

Figure 3:
FIG. 3 is a thermo-viewer photograph of a ceramic heater according to Example 1.
Figure 4:
FIG. 4 is a thermo-viewer photograph of a ceramic heater according to Comparative Example 1.
Figure 5:
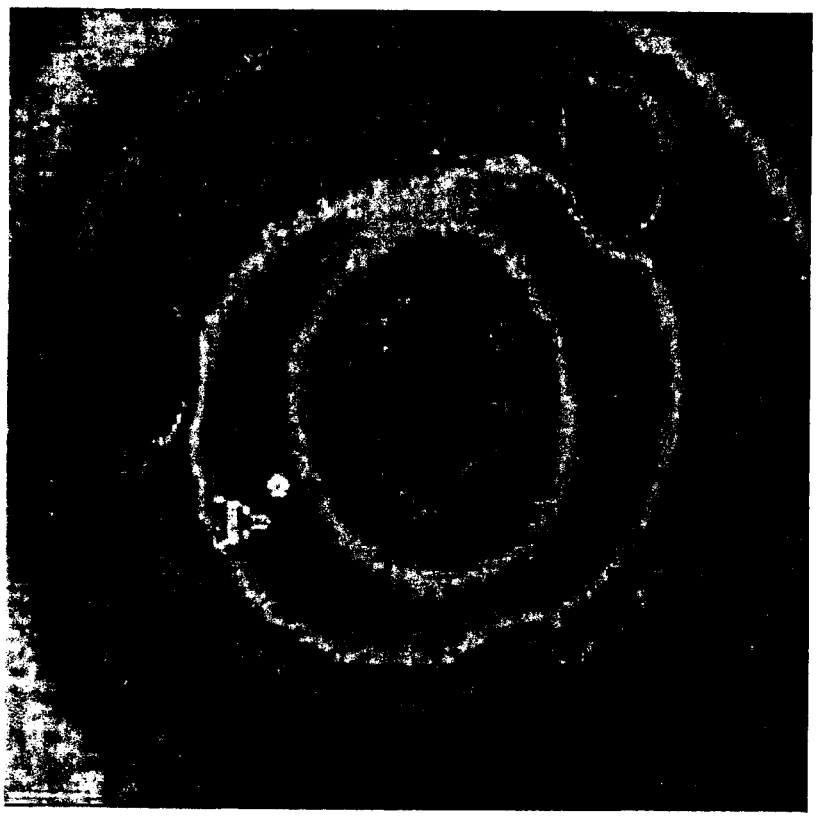
FIG. 5 is a thermo-viewer photograph of a ceramic heater according to Comparative Example 2.

A thermo-viewer photograph showing the temperature difference in the vicinity of the through holes in Example 1 is shown in FIG. 3. Thermo-viewer photographs showing the temperature differences in the vicinity of the through holes in Comparative Example 1 and Comparative Example 2 are shown in FIGS. 4 and 5, respectively. In FIG. 3, a difference in tone between the temperature in the vicinity of the through holes and portions apart from the through holes is not observed, but in FIGS. 4 and 5 a difference of tone is clear.

The results are shown in Table 1.

TABLE 1

| | Surface roughness (μm) | | Temperature difference | Temperature-rising |
|---|---|---|---|---|
| | Rmax | Ra | (° C.) | time (seconds) |
| Example 1 | 5 | 0.3 | 3 | 45 |
| Example 2 | 120 | 18 | 5 | 45 |
| Example 3 | 20 | 5 | 4 | 45 |
| Example 4 | 0.5 | 0.01 | 4 | 45 |

TABLE 1-continued

| | Surface roughness (μm) | | Temperature difference | Temperature-rising |
|---|---|---|---|---|
| | Rmax | Ra | (° C.) | time (seconds) |
| Example 5 | 5 | 3 | 3 | 45 |
| Example 6 | 0.06 | 0.01 | 3 | 45 |
| Example 7 | 5 | 0.4 | 3 | 80 |
| Example 8 | 6 | 0.3 | 3 | 200 |
| Example 9 | 5 | 0.3 | 3 | 50 |
| Comparative Example 1 | 210 | 25 | 8 | 45 |
| Comparative Example 2 | 0.03 | 0.004 | 8 | 45 |
| Comparative Example 3 | 210 | 25 | 4 | 300 |
| Comparative Example 4 | 5 | 0.3 | 8 | 50 |

By adjusting the surface roughness Rmax of the through holes into the range of 0.05 to 200 μm, a drop in the temperature in the vicinity of the through holes can be made small. On the other hand, in case that the substrate is thick, a drop in the temperature in the vicinity of the through holes is not easily generated, as understood from Comparative Example 3. It is presumed that air tends to remain inside the through holes. The present invention can solve a problem which is specifically caused in case that the thickness of the substrate is 50 mm or less.

The resistance heating elements are desirably formed within the range of 20 mm or less from the inner walls of the through holes.

INDUSTRIAL APPLICABILITY

As described above, according to the present invention, a drop in the temperature in the vicinity of the through holes is not easily generated. As a result, the temperature in the heating face of the ceramic heater can be made even.

What is claimed is:

1. A ceramic heater comprising: a ceramic substrate; and a resistance heating element formed on the surface of said ceramic substrate or inside said ceramic substrate, said ceramic substrate being equipped with a through hole, wherein the wall face of said through hole has a surface roughness of Rmax=0.05 to 200 μm based on JIS B 0601.

2. The ceramic heater according to claim 1, wherein said ceramic substrate is in a disc-shape.

3. The ceramic heater according to claim 1, wherein said ceramic substrate is a carbide ceramic or a nitride ceramic.

4. The ceramic heater according to claim 1, wherein the thickness of said ceramic substrate is 50 mm or less.

5. The ceramic heater according to claim 2, wherein said ceramic substrate is a carbide ceramic or a nitride ceramic.

6. The ceramic heater according to claim 2, wherein the thickness of said ceramic substrate is 50 mm or less.

7. The ceramic heater according to claim 2, wherein a semiconductor wafer is held apart from the ceramic substrate.

8. The ceramic heater according to claim 2, wherein said ceramic substrate has a diameter of 200 mm or more.

9. The ceramic heater according to claim 2, wherein said ceramic substrate has a diameter of 300 mm or more.

10. The ceramic heater according to claim 1, wherein said through hole is for a lifter pin which is inserted thereinto.

11. The ceramic heater according to claim 2, wherein said through hole is for a lifter pin which is inserted thereinto.

12. The ceramic heater according to claim 2, wherein said through hole has a diameter of 0.05 to 20 mm.

13. The ceramic heater according to claim 2, wherein said through hole has a diameter of 0.05 to 20 mm.

14. The ceramic heater according to claim 1, wherein the distance between said resistance heating element and an inner wall of said through hole is 20 or less.

15. The ceramic heater according to claim 2, wherein the distance between said resistance heating element and an inner wall of said through hole is 20 mm or less.

16. The ceramic heater according to claim 1, wherein said ceramic substrate contains an alkali metal oxide, an alkali earth metal oxide or a rare element oxide.

17. The ceramic heater according to claim 2, wherein said ceramic substrate contains an alkali metal oxide, an alkali earth metal oxide or a rare element oxide.

18. The ceramic heater according to claim 1, wherein said ceramic heater is used at 100° C. or higher.

19. The ceramic heater according to claim 1, wherein said ceramic heater is used at 200° C. or higher.

20. The ceramic heater according to claim 1, wherein said ceramic heater is used as a device for producing a semiconductor or examining a semiconductor.

21. The ceramic heater according to claim 2, wherein said ceramic heater is used as a device for producing a semiconductor or examining a semiconductor.

* * * * *